US012635550B2

(12) United States Patent
Saito

(10) Patent No.: US 12,635,550 B2
(45) Date of Patent: May 19, 2026

(54) SEMICONDUCTOR DEVICE AND METHOD OF MANUFACTURING THE SAME

(71) Applicant: FUJI ELECTRIC CO., LTD., Kawasaki (JP)

(72) Inventor: Takashi Saito, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 347 days.

(21) Appl. No.: 18/226,961

(22) Filed: Jul. 27, 2023

(65) Prior Publication Data

US 2023/0369276 A1 Nov. 16, 2023

Related U.S. Application Data

(63) Continuation of application No. PCT/JP2022/025088, filed on Jun. 23, 2022.

(30) Foreign Application Priority Data

Aug. 12, 2021 (JP) ................................. 2021-131674

(51) Int. Cl.
$H10W\ 72/30$ (2026.01)
$H10W\ 72/00$ (2026.01)
$H10W\ 90/00$ (2026.01)

(52) U.S. Cl.
CPC ......... *H10W 72/30* (2026.01); *H10W 72/013* (2026.01); *H10W 72/073* (2026.01);
(Continued)

(58) Field of Classification Search
CPC ......... H01L 24/32; H01L 24/83; H01L 24/26; H01L 24/27; H01L 23/24; H01L 23/053;
(Continued)

(56) References Cited

U.S. PATENT DOCUMENTS 8,253,233 B2 8/2012 Guth et al.
8,415,207 B2 4/2013 Guth et al.
(Continued)

FOREIGN PATENT DOCUMENTS

DE 11 2022 000 219 T5 8/2023
JP 2014-29897 A 2/2014
(Continued)

OTHER PUBLICATIONS

International Search Report dated Aug. 16, 2022 for International Application No. PCT/JP2022/025088.
Written Opinion of the International Searching Authority dated Aug. 16, 2022 for International Application No. PCT/JP2022/025088.
German Office Action dated Feb. 19, 2026 for the corresponding German Patent Application No. 112022000346.4.

*Primary Examiner* — Mouloucoulaye Inoussa

(57) ABSTRACT

Provided is a method of manufacturing a semiconductor device that can lead a surface of sinter paste to be flattened before depositing a power semiconductor chip so as to achieve high-density packaging. The manufacturing method applies sinter paste having a surface provided with a projection to a main surface of a conductive plate, dries the sinter paste, flattens the surface of the sinter paste by applying a pressure to the sinter paste so as to squash the projection on the surface of the sinter paste, deposits a semiconductor chip on the main surface of the conductive plate with the sinter paste interposed, and sinters the sinter paste by heating and pressure application to form a bonding layer so as to bond the conductive plate and the semiconductor chip together via the bonding layer.

4 Claims, 19 Drawing Sheets

(52) U.S. Cl.
CPC ............................ *H10W 72/01351* (2026.01);
*H10W 72/07331* (2026.01); *H10W 90/736*
(2026.01)

(58) Field of Classification Search
CPC ............... H01L 23/3735; H01L 25/072; H01L
23/49513; H01L 23/49524; H01L
23/49562; H01L 23/562; H01L 24/05;
H01L 2224/2784; H01L 2224/8384;
H01L 2224/2747; H01L 2224/32245;
H01L 2224/04026; H01L 2224/05124;
H01L 2224/05147; H01L 2224/05155;
H01L 2224/05624; H01L 2224/05639;
H01L 2224/05644; H01L 2224/05647;
H01L 2224/05655; H01L 2224/29199;
H01L 2224/29311; H01L 2224/29324;
H01L 2224/29339; H01L 2224/29347;
H01L 2224/29355; H01L 2224/29386;
H01L 2224/04042; H01L 2224/0603;
H01L 2224/06051; H01L 2224/06181;
H01L 2224/11312; H01L 2224/11318;
H01L 2224/11848; H01L 2224/13294;
H01L 2224/13339; H10W 40/255; H10W
70/60; H10W 70/66; H10W 72/20; H10W
40/258; H10W 72/013; H10W 70/461;
H10W 70/041; H10W 70/417; H10W
70/466; H10W 70/481; H10W 72/90;
C22C 9/02; C22C 13/00; B23K 35/025;
B23K 35/262; H01B 1/02
See application file for complete search history.

(56) References Cited

U.S. PATENT DOCUMENTS

| | | | | |
|---|---|---|---|---|
| 8,835,299 | B2 | 9/2014 | Speckels et al. | |
| 11,024,598 | B2 | 6/2021 | Takemasa et al. | |
| 2011/0168242 | A1* | 7/2011 | Duerr | H01G 9/2095 |
| | | | | 977/773 |
| 2016/0002110 | A1* | 1/2016 | Izumi | C04B 35/12 |
| | | | | 156/89.28 |
| 2017/0080682 | A1* | 3/2017 | Joshi | C22C 21/00 |
| 2017/0095891 | A1* | 4/2017 | Anderson | C22C 9/02 |
| 2017/0263586 | A1* | 9/2017 | Joshi | H01L 24/83 |
| 2017/0271294 | A1* | 9/2017 | Chen | H01L 24/32 |
| 2017/0294404 | A1* | 10/2017 | Inoue | B23K 35/0244 |
| 2018/0190611 | A1* | 7/2018 | Tatsumi | H01L 23/3735 |
| 2018/0197833 | A1* | 7/2018 | Sakakibara | H01L 24/83 |
| 2019/0006268 | A1* | 1/2019 | Sugiura | H01L 23/49513 |
| 2019/0229083 | A1* | 7/2019 | Joshi | C09J 1/00 |
| 2019/0393188 | A1 | 12/2019 | Takemasa et al. | |
| 2020/0043834 | A1* | 2/2020 | Shiraki | H01L 23/3735 |
| 2023/0335527 | A1 | 10/2023 | Saito | |

FOREIGN PATENT DOCUMENTS

| | | | |
|---|---|---|---|
| JP | 2015-103791 | A | 6/2015 |
| JP | 2015-216160 | A | 12/2015 |
| JP | 2017-143094 | A | 8/2017 |
| JP | 2018-148168 | A | 9/2018 |
| JP | 2019-216183 | A | 12/2019 |
| WO | 2018/037992 | A1 | 3/2018 |

* cited by examiner

SEMICONDUCTOR DEVICE AND METHOD OF MANUFACTURING THE SAME

CROSS-REFERENCE TO RELATED APPLICATION

This application is a Continuation of PCT Application No. PCT/JP2022/025088, filed on Jun. 23, 2022, and claims the priority of Japanese Patent Application No. 2021-131674, filed on Aug. 12, 2021, the content of which are incorporated herein by reference.

TECHNICAL FIELD

The present invention relates to a semiconductor device (a semiconductor module) equipped with power semiconductor chips and a method of manufacturing the same.

BACKGROUND ART

IGBT modules (semiconductor modules) for industrial use typically have a configuration in which a power semiconductor chip, an insulated circuit substrate, and a heat-releasing member are bonded together by soldering to be finally attached to a cooling fin via a thermal compound. In a field of vehicle use, a direct water-cooling structure is used in which an insulated circuit substrate and a cooling fin are bonded together by soldering without the use of a thermal compound.

While conventional bonding between a semiconductor chip and a heat-releasing member is executed mainly by soldering, research on the technique of sinter bonding has been promoted recently that uses nanoparticles or microparticles of metal such as silver (Ag) in order to enhance high heat resistance, high heat-releasing performance, and high reliability of products. The sinter-bonding technique can provide bonded layers having high heat resistance and high reliability without a bonding temperature increased, since the layers can be bonded together at a low temperature and have the characteristics of having the same melting point as the metal of nanoparticles or microparticles after being bonded together.

U.S. Pat. No. 8,253,233 B2 and U.S. Pat. No. 8,415,207 B2 each disclose a method of applying sinter material (sinter paste) in a paste state by use of a mask, and depositing a semiconductor chip on the sinter paste and then executing heating and pressure-application treatment. U.S. Pat. No. 8,835,299 B2 discloses a method of depositing a semiconductor chip on sinter paste, and then executing heating and pressure-application treatment before sintering the sinter paste.

JP 2019-216183 A discloses that paste projections are formed when a mask is removed after sinter paste is applied. JP 2018-148168 A discloses a semiconductor device having a structure in which an outer circumferential edge of a bonding material has a larger size than that of a semiconductor element.

SUMMARY OF THE INVENTION

Technical Problem

A surface configuration of the sinter paste during printing is an important issue for the sinter-bonding technique that mainly uses the sinter paste, since the sinter paste is not melted, which differs from solder material. The surface of the sinter paste adjacent to end parts is sometimes provided with projections during printing. The cause of projections on the surface of the sinter material would lead a power semiconductor chip to be pressed unevenly when deposited on the sinter paste to be bonded together, which could cause damage to the power semiconductor chip. Further, the cause of projections preliminarily requires an extra printing area for the sinter paste in order to deposit the semiconductor chip while avoiding the projections on the surface of the sinter paste, which impedes an increase in packaging density.

In view of the foregoing problems, the present invention provides a semiconductor device having a configuration with a surface of sinter paste flattened stably before a deposition of a power semiconductor chip so as to achieve high-density packaging, and also provides a method of manufacturing the same.

Solution to Problem

An aspect of the present invention inheres in a semiconductor device including: (a) a conductive plate having a main surface; (b) a semiconductor chip arranged to be opposed to the main surface of the conductive plate; and (c) a bonding layer including sinter material and interposed between the conductive plate and the semiconductor chip, wherein a porosity of a middle part of the bonding layer is different from a porosity of at least a part of end parts of the bonding layer.

Another aspect of the present invention inheres in a method of manufacturing a semiconductor device, including: (a) applying sinter paste having a surface provided with a projection to a main surface of a conductive plate; (b) drying the sinter paste; (c) flattening the surface of the sinter paste by applying a pressure to the sinter paste so as to squash the projection on the surface of the sinter paste; (d) depositing a semiconductor chip on the main surface of the conductive plate with the sinter paste interposed; and (e) sintering the sinter paste by heat application and pressure application to form a bonding layer so as to bond the conductive plate and the semiconductor chip together with the bonding layer interposed.

DETAILED DESCRIPTION

Figure 1:
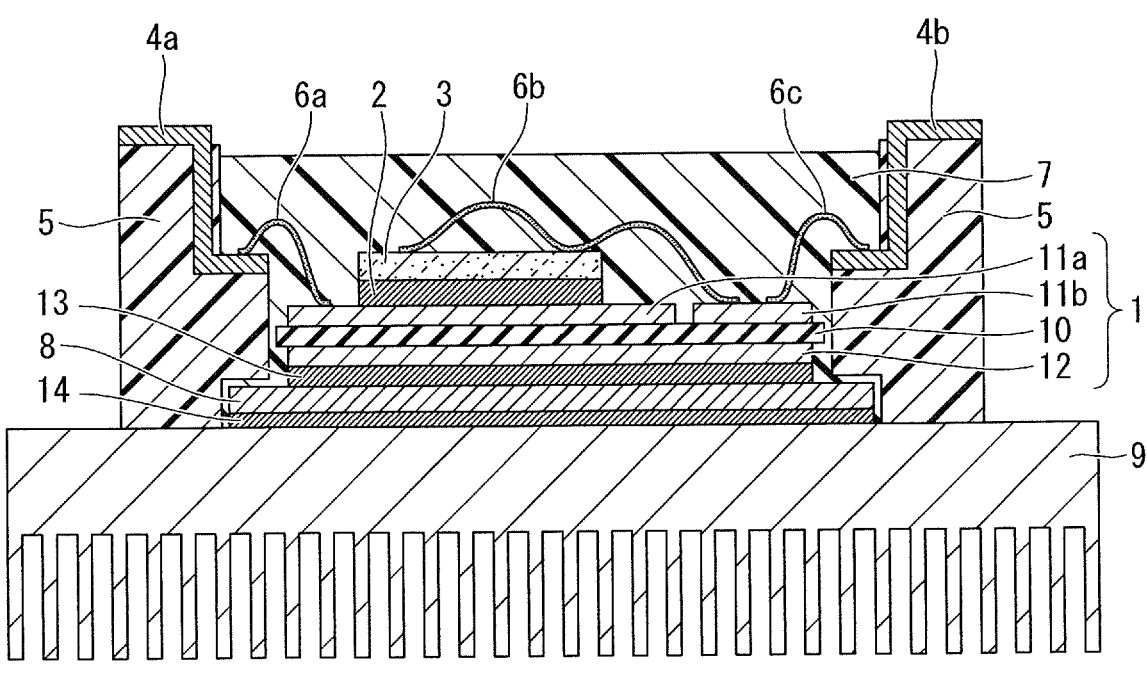
FIG. 1 is a cross-sectional view illustrating a semiconductor device according to a first embodiment.

With reference to the drawings, first to fifth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Moreover, in some drawings, portions are illustrated with different dimensional relationships and proportions. The first to fifth embodiments described below merely illustrate schematically devices and methods for specifying and giving shapes to the technical idea of the present invention, and the span of the technical idea is not limited to materials, shapes, structures, and relative positions of elements described herein.

Additionally, definitions of directions such as upper and lower in the following description are simply definitions for convenience of description, and do not limit the technological concept of the present invention. For example, when observing an object rotated by 90 degrees, the upper and lower are converted to left and right to be read, and when observing an object rotated by 180 degrees, the upper and lower are read reversed, which should go without saying.

First Embodiment

A semiconductor device (a semiconductor module) according to a first embodiment includes an insulated circuit substrate 1, a semiconductor chip (a power semiconductor chip) 3 arranged to be opposed to a main surface (the top surface) of the insulated circuit substrate 1, and a bonding layer 2 including sinter material and interposed between the insulated circuit substrate 1 and the semiconductor chip 3, as illustrated in FIG. 1.

The insulated circuit substrate 1 may be a direct copper bonded (DCB) substrate or an active metal brazed (AMB) substrate, for example. The insulated circuit substrate 1 includes an insulating plate 10, conductive plates (circuit plates) 11$a$ and 11$b$ deposited on the top surface of the insulating plate 10, and a conductive plate (a heat-releasing plate) 12 deposited on the bottom surface of the insulating plate 10. The insulating plate 10 is a ceramic substrate made from aluminum oxide ($Al_2O_3$), aluminum nitride (AlN), or silicon nitride ($Si_3N_4$), or a resin insulating substrate including polymer material, for example. The conductive plates 11$a$ and 11$b$ and the conductive plate 12 are each conductor foil of metal such as copper (Cu) and aluminum (Al), for example.

The sinter material included in the bonding layer 2 is obtained such that metallic particle paste (conductive paste) is sintered in which metallic particles of gold (Au), silver (Ag), or copper (Cu), for example, are dispersed in an organic component to be a paste state. The metallic particles have a fine particle diameter in a range of about several nanometers to several micrometers. The Ag-based sinter material, for example, has the characteristics of being able to be bonded at a low temperature and led to have the same melting point as Ag after being bonded, and thus can provide a bonding layer having high heat resistance and high reliability without a bonding temperature increased.

The semiconductor chip 3 is deposited to be opposed to the main surface (the top surface) of the conductive plate 11$a$. The semiconductor chip 3 as used herein can be an insulated gate bipolar transistor (IGBT), a field-effect transistor (FET), a static induction (SI) thyristor, a gate turn-off (GTO) thyristor, or a freewheeling diode (FWD), for example. The semiconductor chip 3 may be a silicon (Si) substrate, or may be a compound semiconductor substrate of a wide-bandgap semiconductor made from silicon carbide (SiC), gallium nitride (GaN), or gallium oxide ($Ga_2O_3$), for example. A bottom-surface electrode made from gold (Au) or the like in the semiconductor chip 3 is bonded to the conductive plate 11$a$ via the bonding layer 2. While FIG. 1 illustrates the case of including the single semiconductor chip 3, the number of the semiconductor chips to be provided can be determined as appropriate depending on a current capacity of the semiconductor module, for example, and the semiconductor module may include two or more semiconductor chips.

A case 5 made from insulating material such as resin is provided to cover the outer circumference of the insulated circuit substrate 1 and the semiconductor chip 3. The case 5 is filled with a sealing member 7 for sealing the bonding layer 2 and the semiconductor chip 3. The sealing member 7 as used herein can be made from insulating material such as silicone gel or thermosetting resin, for example. External terminals 4$a$ and 4$b$ are fixed to the case 5. The semiconductor chip 3, the conductive plates 11$a$ and 11$b$, and the external terminals 4$a$ and 4$b$ are electrically connected to each other via bonding wires 6$a$, 6$b$, and 6$c$.

A heat-releasing base 8 made from metal such as copper (Cu) is provided on the bottom surface side of the insulated circuit substrate 1 with a bonding layer 13 interposed. A heat-releasing fin 9 made from metal such as copper (Cu) is further provided on the bottom surface side of the heat-releasing base 8 with a bonding layer 14 interposed. The respective bonding layers 13 and 14 as used herein can be made from sinter material, solder material, or thermal interface material (TIM), for example. The respective bonding layers 13 and 14 may be either made from the same material as the bonding layer 2 or made from material different from that of the bonding layer 2.

Figure 2:
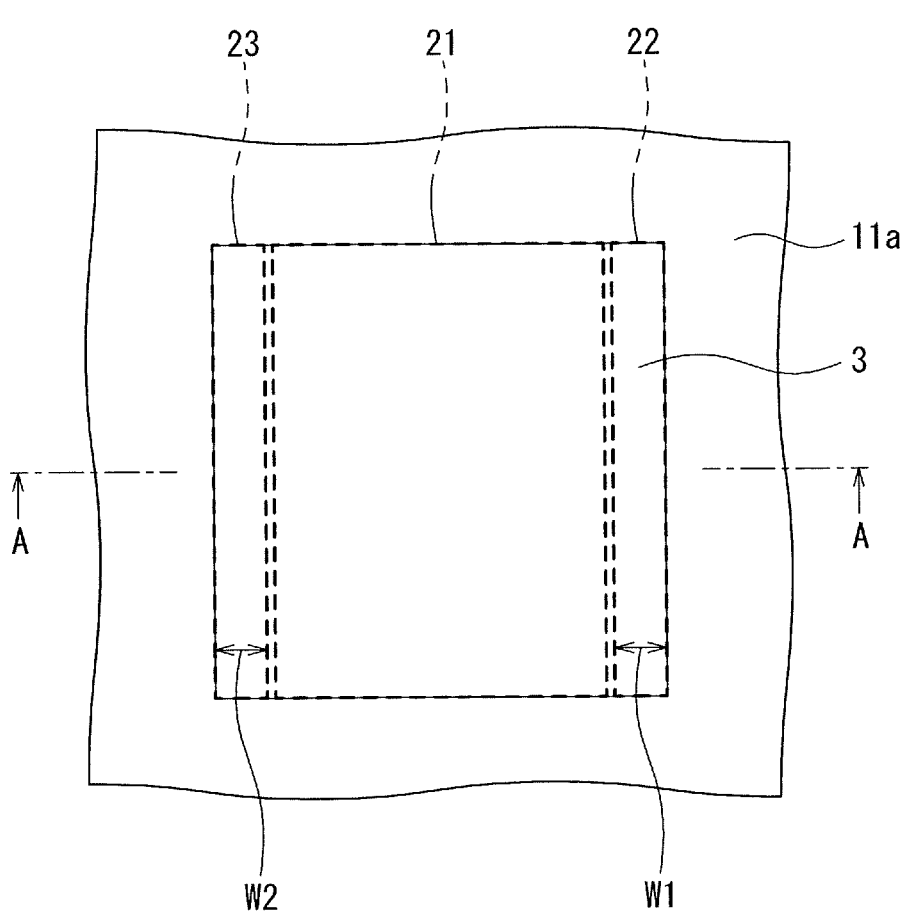
FIG. 2 is a plan view illustrating a part of the semiconductor device according to the first embodiment.
Figure 3:
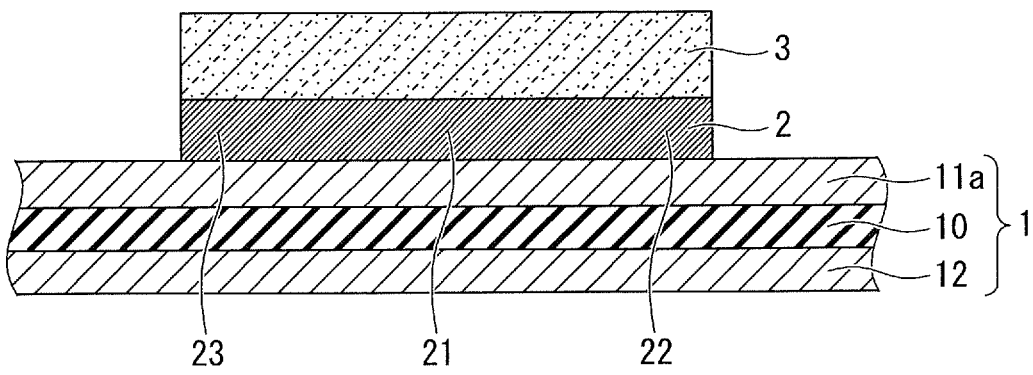
FIG. 3 is a cross-sectional view as viewed from direction A-A in FIG. 2.

FIG. 2 is a plan view illustrating the conductive plate 11*a* of the insulated circuit substrate 1 and the semiconductor chip 3 in the semiconductor device according to the first embodiment illustrated in FIG. 1, and FIG. 3 is a cross-sectional view as viewed from direction A-A in FIG. 2. As illustrated in FIG. 2 and FIG. 3, the semiconductor chip 3 has a rectangular planar pattern. The semiconductor chip 3 has a size set in a range of about 1 millimeter×1 millimeter or greater and 10 millimeters×10 millimeters or smaller, for example, but is not limited to this range.

As illustrated in FIG. 2 and FIG. 3, the bonding layer 2 has a rectangular planar pattern, and the outer edge of the bonding layer 2 conforms to the outer edge of the semiconductor chip 3. The outer edge of the bonding layer 2 may be located either on the outside or on the inside of the outer edge of the semiconductor chip 3 instead. In other words, the size of the bonding layer 2 may be either greater than or smaller than the size of the semiconductor chip 3. The term "rectangular shape" as used herein that is the planar pattern of the bonding layer 2 encompasses not only a completely rectangular shape but also a shape that can be considered to be a substantially rectangular shape, such as solder fillet, and further encompasses a shape having end parts not completely parallel to those of the semiconductor chip 3.

FIG. 2 schematically indicates a middle part 21 and end parts 22 and 23 of the bonding layer 2 by the broken lines. As illustrated in FIG. 2 and FIG. 3, the end parts 22 and 23 of the bonding layer 2 correspond to the two sides opposed to each other defining the rectangle of the planar pattern of the bonding layer 2 having the four sides. A width W1 of the end part 22 and a width W2 of the end part 23 are each about one millimeter, for example, but are not limited to this case and may be determined as appropriate. A surface maximum height Rz of the top surface of the bonding layer 2 in contact with the semiconductor chip 3 is about 10 micrometers or smaller.

A porosity between the metallic particles included in the bonding layer 2 in the middle part 21 of the bonding layer 2 is different from a porosity between the metallic particles included in the bonding layer 2 in at least a part of the respective end parts 22 and 23. According to the first embodiment, the porosity between the metallic particles in the middle part 21 of the bonding layer 2 is higher than the porosity between the metallic particles in the end part 22 on one side of the bonding layer 2. The porosity between the metallic particles in the middle part 21 of the bonding layer 2 is lower than the porosity between the metallic particles in the end part 23 on the other side of the bonding layer 2.

The semiconductor device according to the first embodiment has a configuration with the surface of the bonding layer 2 flattened before the deposition of the semiconductor chip 3 during the process of manufacturing the semiconductor device according to the first embodiment, so as to provide the bonding layer 2 with a stable shape and prevent damage to the semiconductor chip 3 derived from the surface configuration of the bonding layer 2. In addition, conforming the size of the bonding layer 2 substantially to the size of the semiconductor chip 3 can achieve the high-density packaging.

<Method of Manufacturing Semiconductor Device>

A method of manufacturing (assembling) the semiconductor device according to the first embodiment is described below with reference to FIG. 4 to FIG. 11. The explanations with reference to FIG. 4 to FIG. 11 are made below while focusing on the cross section corresponding to FIG. 3.

Figure 4:
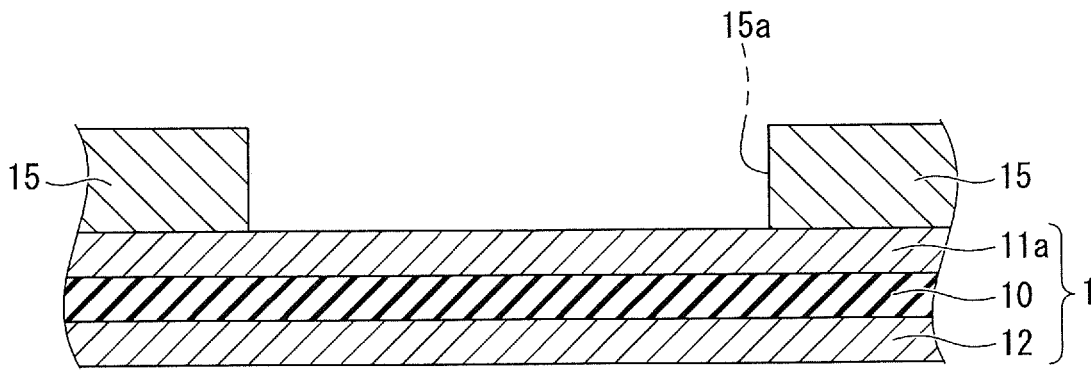
FIG. 4 is a cross-sectional process view illustrating a method of manufacturing the semiconductor device according to the first embodiment.

First, a sinter-material application process (a screen-printing process) is executed. The sinter-material application process includes a step of preparing the insulated circuit substrate 1, and depositing a mask (a metal mask) 15 of metal such as aluminum (Al) or stainless steel (SUS) on the conductive plate 11*a* of the insulated circuit substrate 1, as illustrated in FIG. 4. The mask 15 is provided with an opening 15*a* at a position corresponding to the bonding layer 2 illustrated in FIG. 3. The size of the opening 15*a* can be determined such that the size of the bonding layer 2 finally conforms to the size of the semiconductor chip 3 illustrated in FIG. 3.

Figure 5:
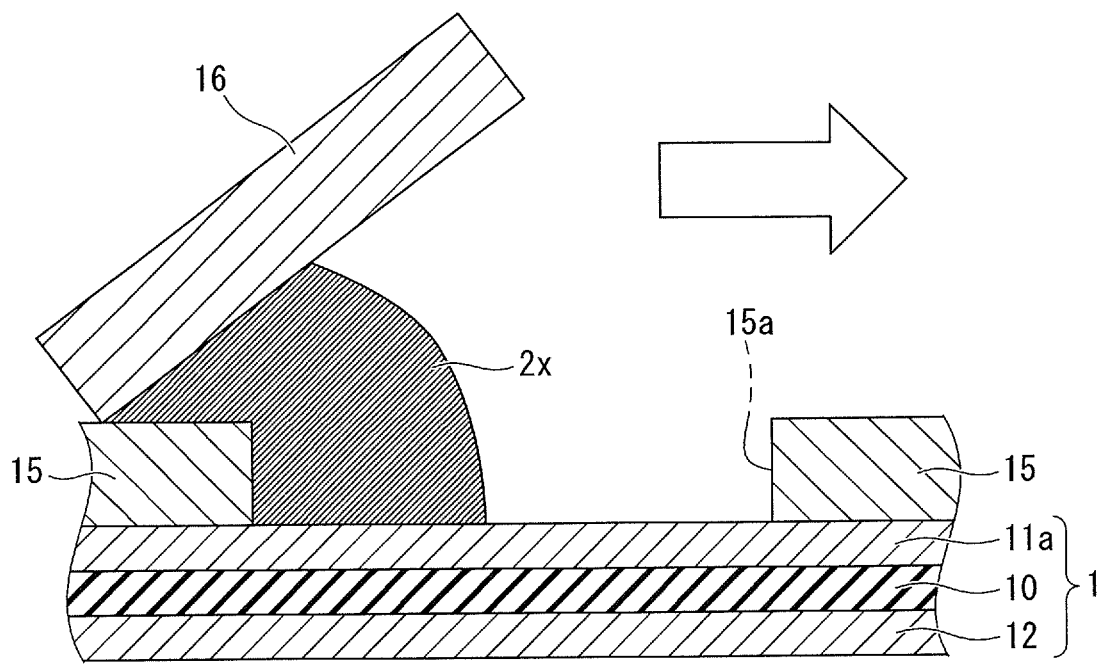
FIG. 5 is a cross-sectional process view continued from FIG. 4, illustrating the method of manufacturing the semiconductor device according to the first embodiment.
Figure 6:
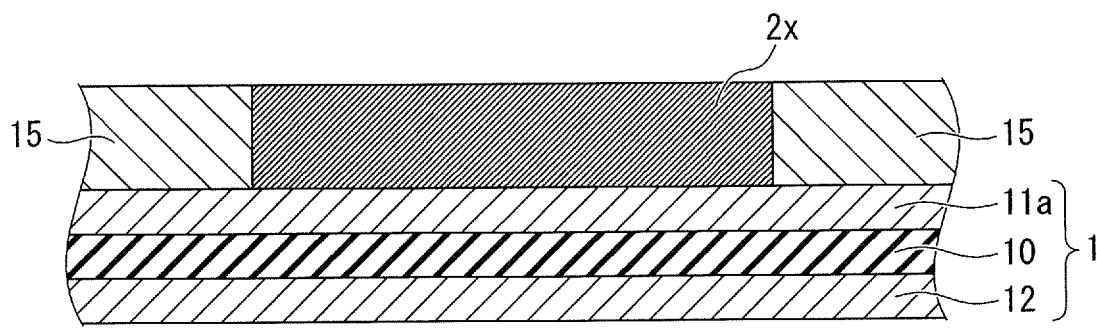
FIG. 6 is a cross-sectional process view continued from FIG. 5, illustrating the method of manufacturing the semiconductor device according to the first embodiment.

Next, as illustrated in FIG. 5, sinter material (sinter paste) 2*x* in a paste state in which metallic particles are dispersed in an organic component is deposited on the mask 15. A squeegee 16 is then led to move (slide) in the advancing direction (in the direction indicated by the arrow in FIG. 5). This step leads the sinter paste 2*x* to be printed on the inside of the opening 15*a* of the mask 15, as illustrated in FIG. 6. The mask 15 is then removed.

At this point, a projection (a rise-up part) 2*a* is provided at the end part 22 of the sinter paste 2*x* in the advancing direction of the squeegee 16. The projection 2*a* has a height higher by about greater than 10 micrometers and 100 micrometers or less, for example, than that of the substantially flat surface of the middle part 21 of the sinter paste 2*x*. The projection 2*a* may have a height higher by about 30 micrometers or greater and 100 micrometers or less, or about 50 micrometers or greater and 100 micrometers or less, for example, than that of the substantially flat surface of the middle part 21 of the sinter paste 2*x*. At the same time, a drop (a print drop) 2*b* is provided at the end part 23 of the sinter paste 2*x* on the opposite side of the advancing direction of the squeegee 16. The drop 2*b* is a part inclined to have a thickness gradually decreasing from the substantially flat surface of the middle part 21 of the sinter paste 2*x*. The drop 2*b* is not necessarily provided.

Next, a paste dry process is executed. The paste dry process includes a step of heating the sinter paste 2*x* at a temperature lower than a sintering temperature upon the sintering of the sinter paste 2*x* to dry the sinter paste 2*x* so as to evaporate and remove a solvent component contained in the sinter paste 2*x*. The heating conditions for the paste dry process includes the heating temperature of about 100° C. or higher and 150° C. or lower, and the heating time of about one minute or longer and 20 minutes or shorter, for example.

Figure 8:
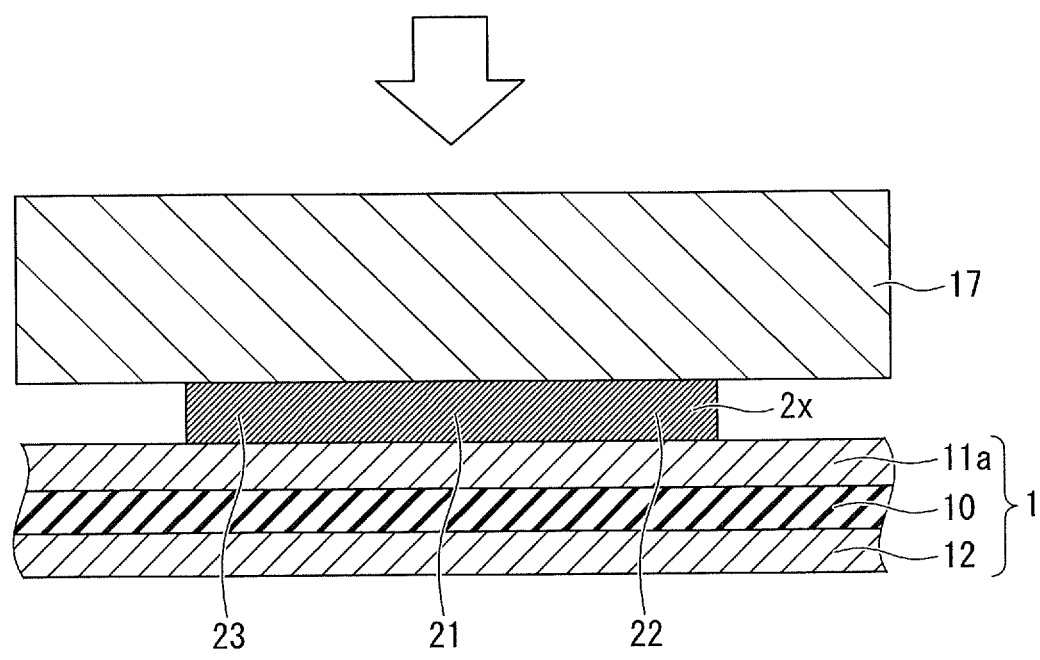
FIG. 8 is a cross-sectional process view continued from FIG. 7, illustrating the method of manufacturing the semiconductor device according to the first embodiment.

Next, a preliminary pressure-application process is executed. The preliminary pressure-application process includes a step of applying pressure to the sinter paste 2*x* to squash the projection 2*a* provided on the surface of the sinter paste 2*x* so as to flatten (smooth) the surface of the sinter paste 2*x*, as illustrated in FIG. 8. The sinter paste 2*x* at this point flows to run in the lateral direction so as to level off the drop 2*b* of the sinter paste 2*x* simultaneously. A pressure-application force set in the preliminary pressure-application process is lower than that during the sintering of the sinter paste 2*x*, and is in a range of about 1 MPa or greater and 20 MPa or smaller, for example.

Figure 9:
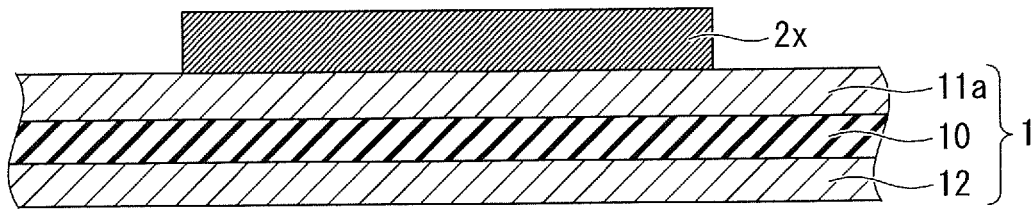
FIG. 9 is a cross-sectional process view continued from FIG. 8, illustrating the method of manufacturing the semiconductor device according to the first embodiment.

The preliminary pressure-application process uses a smooth plate (a flat plate) 17 to apply the pressure to the sinter paste 2*x*, as illustrated in FIG. 8, for example. The flat plate 17 is preferably made from material that provides a passivation coating not bonded or hardly bonded to the sinter paste 2*x*. A specific example of the material used for the flat plate 17 can be aluminum (Al) or stainless steel (SUS). The flat plate 17 is then removed, as illustrated in FIG. 9. The surface maximum height Rz of the sinter paste 2x after the execution of the preliminary pressure-application process is about 10 micrometers or less.

Figure 10:
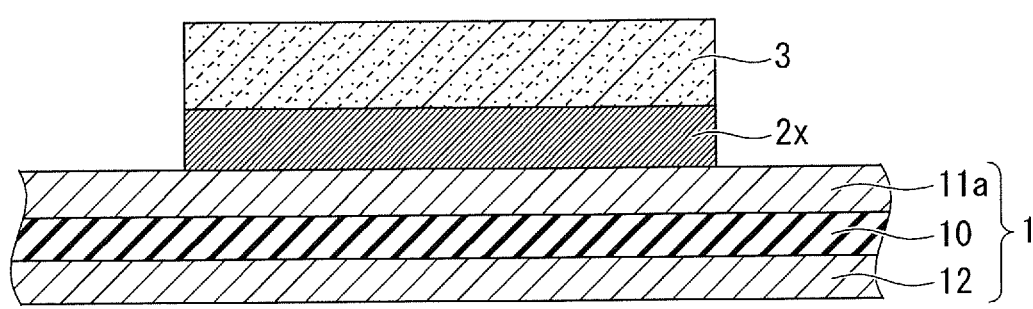
FIG. 10 is a cross-sectional process view continued from FIG. 9, illustrating the method of manufacturing the semiconductor device according to the first embodiment.
Figure 11:
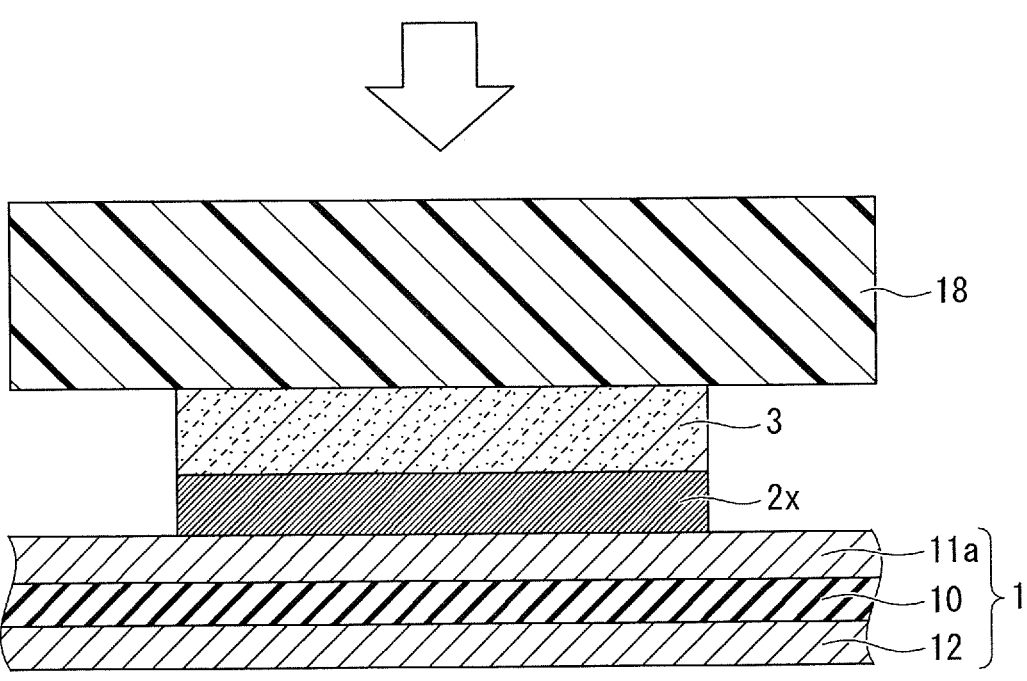
FIG. 11 is a cross-sectional process view continued from FIG. 10, illustrating the method of manufacturing the semiconductor device according to the first embodiment.

Next, a chip bonding process is executed. The chip bonding process includes a step of depositing the semiconductor chip 3 on the conductive plate 11a of the insulated circuit substrate 1 with the sinter paste 2x interposed, as illustrated in FIG. 10. Next, as illustrated in FIG. 11, a pressure is applied to the semiconductor chip 3 from the top surface side with a metal die of a pressing device or a pressure-application part 18 made from silicon (Si) rubber or the like attached to the metal die. Heating the sinter paste 2x at a temperature higher than the sintering temperature while applying the pressure to the semiconductor chip 3 causes a sinter reaction to the sinter paste 2x. This process is executed under the conditions of the pressure-application force set in a range of about 1 MPa or greater and 60 MPa or smaller, the heating temperature set in a range of about 200° C. or higher and 350° C. or lower, and the heating time set in a range of about 1 minute or longer and 10 minutes or shorter, for example. This process leads the sinter paste 2x to be sintered to provide the bonding layer 2 so as to bond the insulated circuit substrate 1 and the semiconductor chip 3 together via the bonding layer 2.

Since the projection 2a at the end part of the sinter paste 2x is squashed in the preliminary pressure-application process illustrated in FIG. 8 as described above, the porosity between the metallic particles included in the middle part of the bonding layer 2 is higher than the porosity between metallic particles included in the end part of the bonding layer 2 corresponding to the side on which the projection 2a is squashed after the sinter paste 2x is sintered to form the bonding layer 2, as illustrated in FIG. 11.

Further, since the middle part of the sinter paste 2x is pressed with a higher pressure than the end part of the sinter paste 2x provided with the drop 2b during the preliminary pressure-application process illustrated in FIG. 8, the porosity between the metallic particles included in the middle part of the bonding layer 2 is lower than the porosity between the metallic particles included in the end part of the bonding layer 2 corresponding to the side provided with the drop 2b after the sinter paste is sintered to form the bonding layer 2, as illustrated in FIG. 11.

Thereafter, the case 5 is arranged to cover the circumference of the insulated circuit substrate 1 and the semiconductor chip 3, and the insulated circuit substrate 1, the semiconductor chip 3, and the external terminals 4a and 4b are connected to each other via the respective bonding wires 6a, 6b, and 6c to then execute a regular process including a step of sealing with the sealing member 7 and the like, so as to complete the semiconductor device according to the first embodiment.

The method of manufacturing the semiconductor device according to the first embodiment, which flattens to level off the surface of the sinter paste 2x in the preliminary pressure-application process illustrated in FIG. 8 before the deposition of the semiconductor chip 3, can also apply an even stress by the pressure application after depositing the semiconductor chip 3 in the chip bonding step illustrated in FIG. 11, so as to form the uniform and stable bonding layer 2. The manufacturing method thus can achieve the semiconductor device having high heat resistance, high heat-releasing performance, and high reliability while achieving a high-density packaging.

While the method of manufacturing the semiconductor device according to the first embodiment is illustrated above with the case of executing the preliminary pressure-application process after the paste dry process, the paste dry process and the preliminary pressure-application process may be executed simultaneously. In such a case, the pressure is applied to the sinter paste 2x by use of the flat plate 17 as illustrated in FIG. 8 while the sinter paste 2x is heated at a temperature lower than the sintering temperature in the paste dry process and the preliminary pressure-application process, so as to flatten the surface of the sinter paste 2x and also dry the sinter paste 2x to remove the solvent component. This process is executed, for example, under the conditions of the pressure application force set in a range of about 1 MPa or greater and 20 MPa or smaller, the heating temperature set in a range of about 100° C. or higher and 150° C. or lower, and the heating time set in a range of about 1 minute or longer and 20 minutes or shorter.

While the method of manufacturing the semiconductor device according to the first embodiment is illustrated above with the case of only executing the pressure application without heating the sinter paste 2x in the preliminary pressure-application process after the paste dry process, the pressure may be applied to the sinter paste 2x by use of the flat plate 17 while the sinter paste 2x is heated at a temperature lower than the sintering temperature in the preliminary pressure-application process. This process is executed, for example, under the conditions of the pressure application force set in a range of about 1 MPa or greater and 20 MPa or smaller, the heating temperature set in a range of about 100° C. or higher and 150° C. or lower, and the heating time set in a range of about 1 minute or longer and 20 minutes or shorter.

Comparative Example

Figure 12:
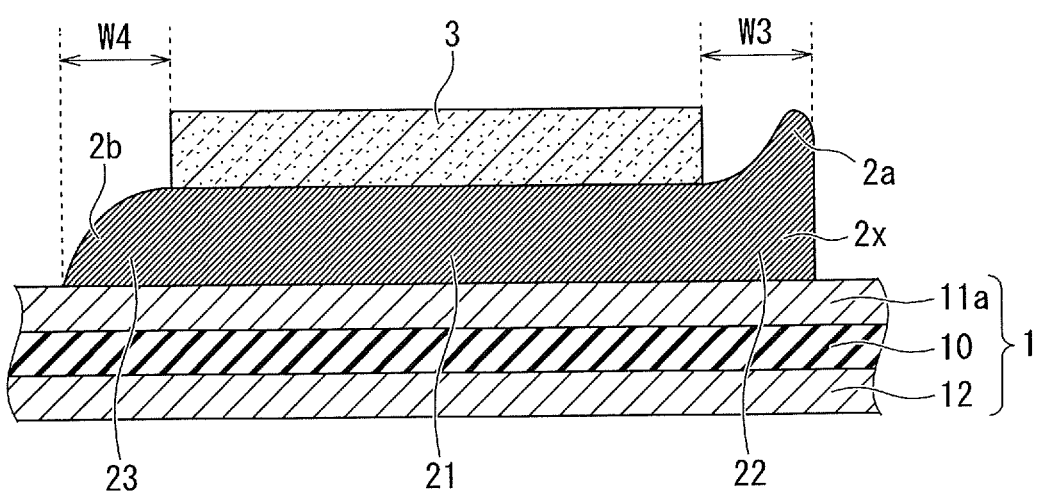
FIG. 12 is a cross-sectional process view illustrating a method of manufacturing a semiconductor device of a comparative example.

A method of manufacturing a semiconductor device of a comparative example is described below. The method of manufacturing the semiconductor device of the comparative example is common to the method of manufacturing the semiconductor device according to the first embodiment illustrated in FIG. 4 to FIG. 7 in including the process of forming the sinter paste 2 by the screen printing and then drying the sinter paste 2x, as illustrated in FIG. 12. The method of manufacturing the semiconductor device of the comparative example differs from the method of manufacturing the semiconductor device according to the first embodiment in depositing the semiconductor chip 3 on the sinter paste 2x as illustrated in FIG. 12, without executing the preliminary pressure-application process illustrated in FIG. 8.

The method of manufacturing the semiconductor device of the comparative example cannot provide the uniform bonding layer 2, since a stress is locally caused on the semiconductor chip 3 when the pressure is applied to the semiconductor chip 3 if deposited on the projection 2a formed on the surface of the sinter paste 2x. Further, the manufacturing method of the comparative example would cause a break in the semiconductor chip 3 starting from the projection 2a on the surface of the sinter paste 2x. The manufacturing method of the comparative example cannot provide the uniform bonding layer 2 either if the semiconductor chip 3 is deposited at the part corresponding to the drop 2b of the sinter paste 2x.

Figure 7:
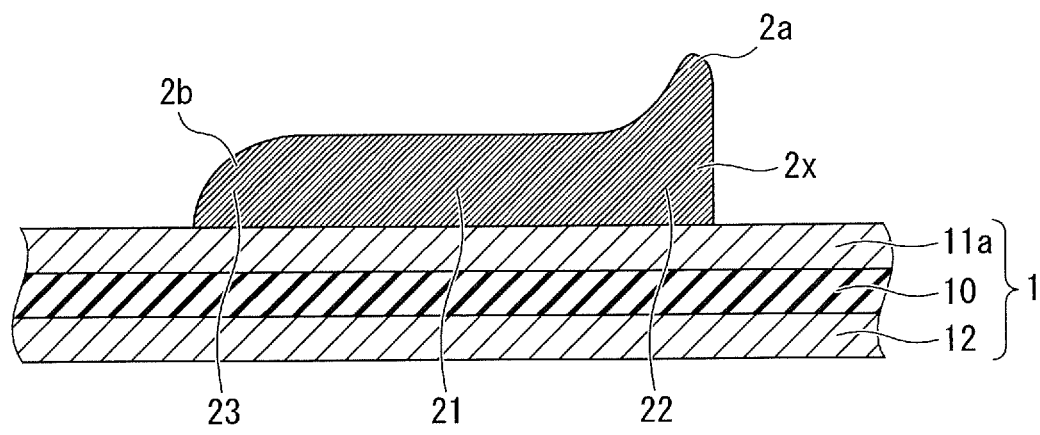
FIG. 7 is a cross-sectional process view continued from FIG. 6, illustrating the method of manufacturing the semiconductor device according to the first embodiment.

To deal with such problems, the method of manufacturing the semiconductor device of the comparative example could increase the print area of the sinter paste 2x more than the print area of the sinter paste 2x in the case illustrated in FIG. 7 for depositing the semiconductor chip 3 while avoiding the projection 2a or the drop 2b on the surface of the sinter paste 2x, as illustrated in FIG. 12. The method of manufacturing the semiconductor device of the comparative example, however, needs to keep extra print areas having widths W3 and W4 at which the projection 2a and the drop 2b are provided on the surface of the sinter paste 2x, which limits the improvement in the packaging density.

In contrast, the method of manufacturing the semiconductor device according to the first embodiment, which flattens the surface of the sinter paste 2x in the preliminary pressure-application process before depositing the semiconductor chip 3, as illustrated in FIG. 8, does not need to provide any extra print areas for the sinter paste 2x as illustrated in FIG. 12, so as to decrease the print area for the sinter paste 2x more than the method of manufacturing the semiconductor device of the comparative example, achieving the high-density packaging accordingly.

Second Embodiment

Figure 13:
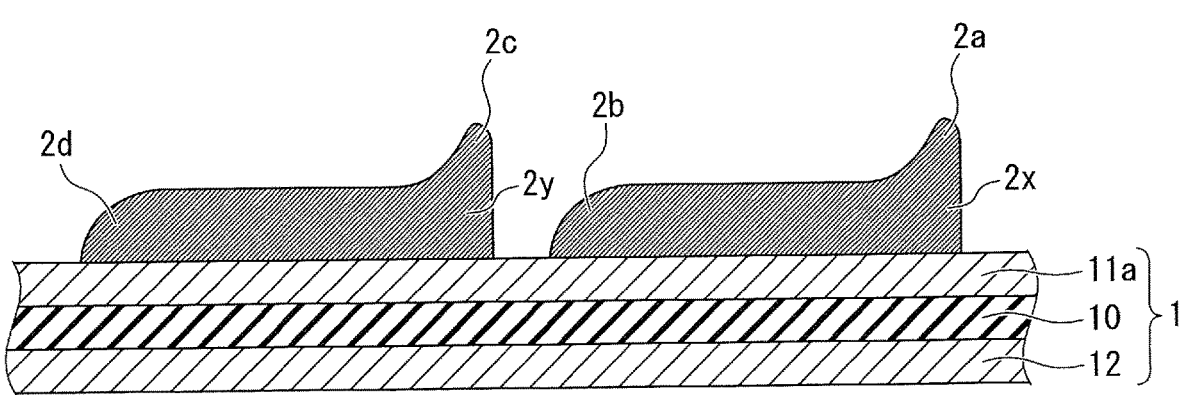
FIG. 13 is a cross-sectional process view illustrating a method of manufacturing a semiconductor device according to a second embodiment.

A method of manufacturing a semiconductor device according to a second embodiment differs from the method of manufacturing the semiconductor device according to the first embodiment illustrated in FIG. 7 in providing plural sinter pastes 2x and 2y by screen printing, as illustrated in FIG. 13. The end part of the sinter paste 2x in the advancing direction of the squeegee 16 illustrated in FIG. 5 is provided with the projection 2a, and the end part of the sinter paste 2x in the direction opposite to the advancing direction of the squeegee 16 is provided with the drop 2b. Similarly, the end part of the sinter paste 2y in the advancing direction of the squeegee 16 illustrated in FIG. 5 is provided with a projection 2c, and the end part of the sinter paste 2y in the direction opposite to the advancing direction of the squeegee 16 is provided with a drop 2d.

Figure 14:
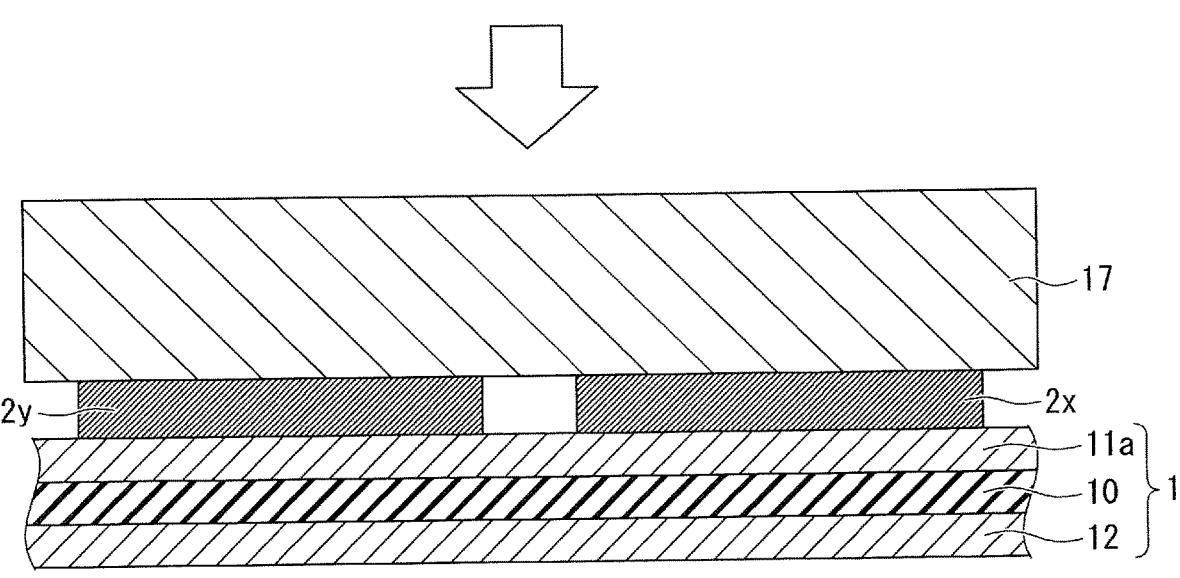
FIG. 14 is a cross-sectional process view continued from FIG. 13, illustrating the method of manufacturing the semiconductor device according to the second embodiment.

The manufacturing method according to the second embodiment, which applies the pressure to the plural sinter pastes 2x and 2y simultaneously by use of the flat plate 17, can also flatten the respective surfaces of the sinter pastes 2x and 2y, as illustrated in FIG. 14. The semiconductor chip is then deposited on each of the respective sinter pastes 2x and 2y. The other processes of the method of manufacturing the semiconductor device according to the second embodiment are the same as those of the method of manufacturing the semiconductor device according to the first embodiment, and overlapping explanations are not repeated below.

The method of manufacturing the semiconductor device according to the second embodiment, which forms the plural sinter pastes 2x and 2y, can also flatten the sinter pastes 2x and 2y simultaneously with the flat plate 17, so as to achieve the effects similar to those by the method of manufacturing the semiconductor device according to the first embodiment. The pressure may be applied to the respective sinter pastes 2x and 2y independently of each other so as to be flattened by use of plural flat plates instead.

Third Embodiment

Figure 15:
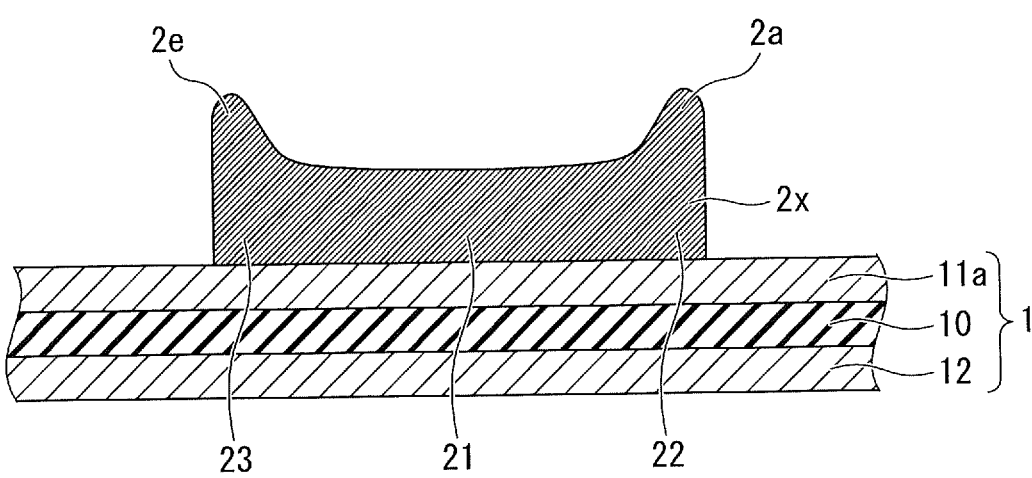
FIG. 15 is a cross-sectional process view illustrating a method of manufacturing a semiconductor device according to a third embodiment.

A method of manufacturing a semiconductor device according to a third embodiment differs from the method of manufacturing the semiconductor device according to the first embodiment illustrated in FIG. 7 in that projections 2a and 2e are provided at the end parts 22 and 23 on both sides of the sinter paste 2x by screen printing, as illustrated in FIG. 15. The projections 2a and 2e could be formed at the end parts 22 and 23 on both sides of the sinter paste 2x depending on the way of moving the squeegee 16, for example.

Figure 16:
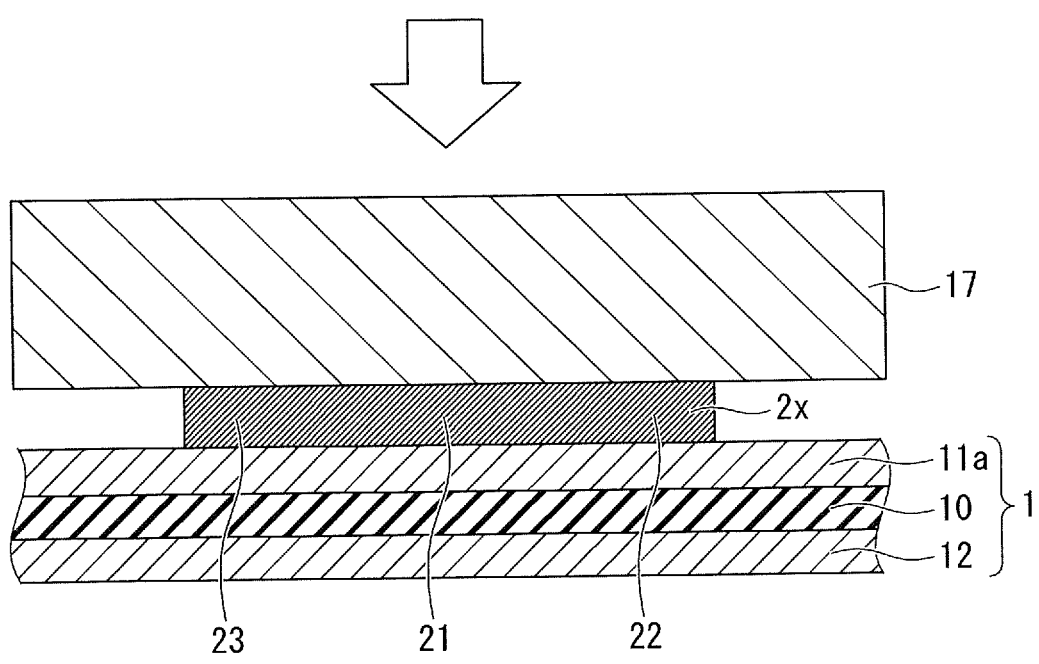
FIG. 16 is a cross-sectional process view continued from FIG. 15, illustrating the method of manufacturing the semiconductor device according to the third embodiment.

The manufacturing method according to the third embodiment also applies the pressure to the sinter paste 2x by use of the flat plate 17 to squash the projections 2a and 2e of the sinter paste 2x so as to flatten the surface of the sinter paste 2x, as illustrated in FIG. 16. The porosity between the metallic particles included in the middle part 21 of the bonding layer 2 after the sinter paste 2x is sintered to form the bonding layer 2 is higher than the porosity between the metallic particles included in the respective end parts 22 and 23 on both sides of the bonding layer 2. The other processes of the method of manufacturing the semiconductor device according to the third embodiment are the same as those of the method of manufacturing the semiconductor device according to the first embodiment, and overlapping explanations are not repeated below.

The method of manufacturing the semiconductor device according to the third embodiment, if causing the plural projections 2a and 2e at the end parts 22 and 23 on both sides of the sinter paste 2x, can also flatten the surface of the sinter paste 2x, so as to achieve the effects similar to those by the method of manufacturing the semiconductor device according to the first embodiment. The sinter paste 2x may be provided with plural projections at other end parts along the entire circumference of the sinter paste 2x including the end parts 22 and 23 on both sides of the sinter paste 2x in the planar pattern. The manufacturing method according to the third embodiment in this case also applies the pressure to the sinter paste 2x with the flat plate 17 to squash all of the projections at the end parts along the entire circumference of the sinter paste 2x, so as to stably flatten the surface of the sinter paste 2x.

Fourth Embodiment

Figure 17:
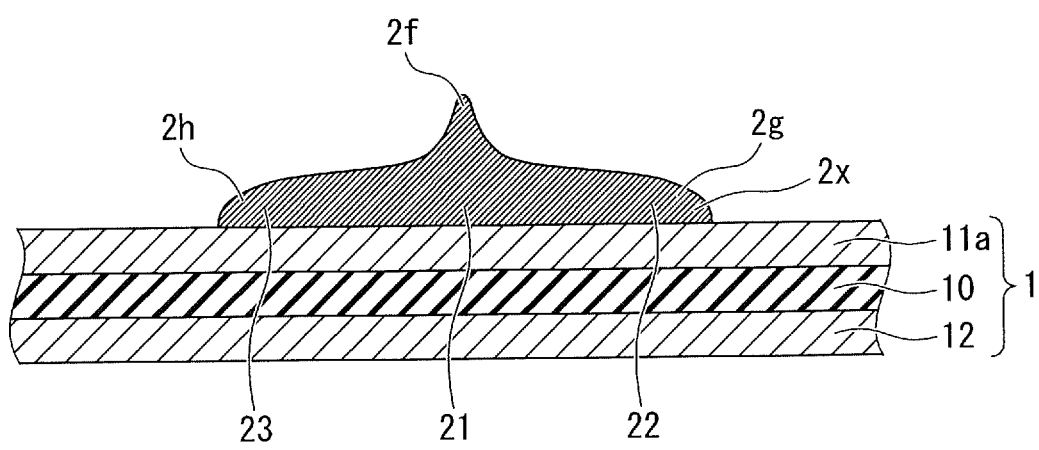
FIG. 17 is a cross-sectional process view illustrating a method of manufacturing a semiconductor device according to a fourth embodiment.

A method of manufacturing a semiconductor device according to a fourth embodiment differs from the method of manufacturing the semiconductor device according to the first embodiment illustrated in FIG. 7 in causing a projection 2f in the middle part 21 of the sinter paste 2x and further causing drops 2g and 2h at the end parts 22 and 23 on both sides of the sinter paste 2x, as illustrated in FIG. 17. The projection 2f could be formed in the middle part 21 of the sinter paste 2x when the sinter paste 2x is applied by use of a dispenser or the like, instead of by means of the screen printing. The drops 2g and 2h may be provided not only at the end parts 22 and 23 on both sides of the sinter paste 2x but also at other end parts along the entire circumference of the sinter paste 2x including the end parts 22 and 23.

Figure 18:
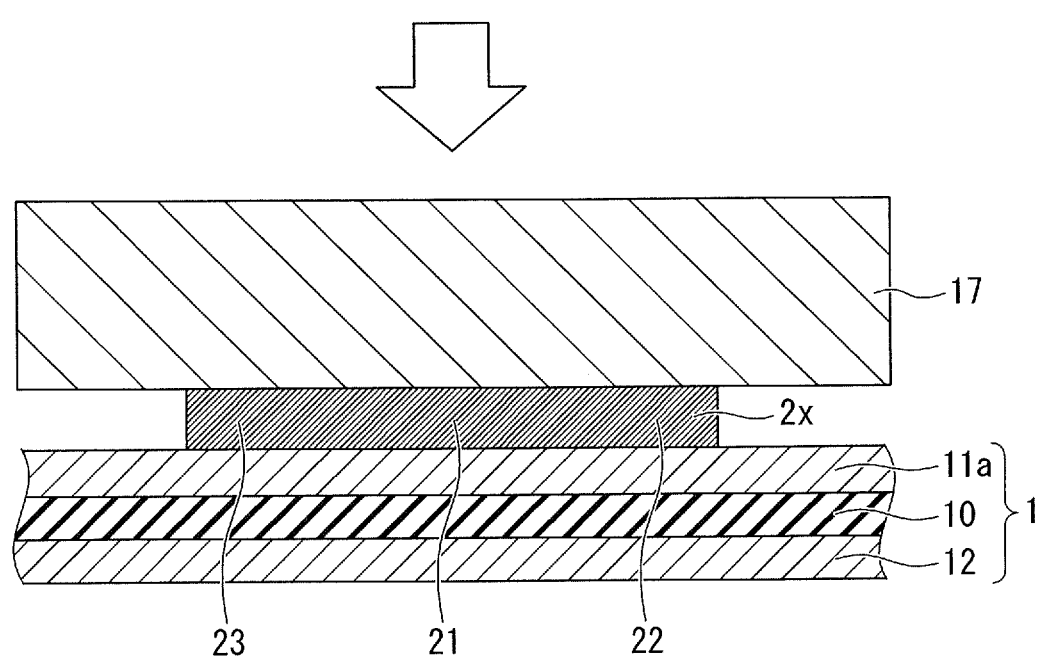
FIG. 18 is a cross-sectional process view continued from FIG. 17, illustrating the method of manufacturing the semiconductor device according to the fourth embodiment.

The manufacturing method according to the fourth embodiment also applies the pressure to the sinter paste 2x by use of the flat plate 17 to squash the projection 2f of the sinter paste 2x and at the same time level off the drops 2g and 2h, so as to flatten the surface of the sinter paste 2x, as illustrated in FIG. 18. The porosity between the metallic particles included in the middle part 21 of the bonding layer 2 after the sinter paste 2x is sintered to form the bonding layer 2 is lower than the porosity between the metallic particles included in the respective end parts 22 and 23 on both sides of the bonding layer 2. The other processes of the method of manufacturing the semiconductor device according to the fourth embodiment are the same as those of the method of manufacturing the semiconductor device according to the first embodiment, and overlapping explanations are not repeated below.

The method of manufacturing the semiconductor device according to the fourth embodiment, if causing the projection $2f$ in the middle part 21 of the sinter paste 2x, can also flatten the surface of the sinter paste 2x, so as to achieve the effects similar to those by the method of manufacturing the semiconductor device according to the first embodiment. As described above, the method of manufacturing the semiconductor device according to the fourth embodiment can flatten the surface of the sinter paste 2x regardless of the position of the projection caused in the sinter paste 2x.

Fifth Embodiment

Figure 19:
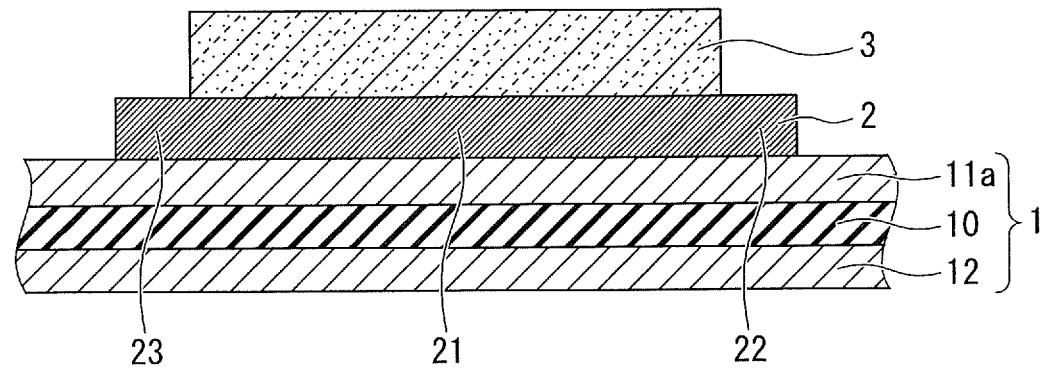
FIG. 19 is a cross-sectional view illustrating a semiconductor device according to a fifth embodiment.

A method of manufacturing a semiconductor device according to a fifth embodiment differs from the method of manufacturing the semiconductor device according to the first embodiment illustrated in FIG. 2 in that the bonding layer 2 has a larger size than the semiconductor chip 3, as illustrated in FIG. 19. The bonding layer 2 is entirely flattened including the parts projecting to the outside from the outer edge of the semiconductor chip 3 before the deposition of the semiconductor chip 3. The surface maximum height Rz of the top surface of the bonding layer 2 including the parts projecting to the outside from the outer edge of the semiconductor chip 3 is about 10 micrometers or less. The other configurations of the semiconductor device according to the fifth embodiment are the same as those of the semiconductor device according to the first embodiment, and overlapping explanations are not repeated below.

The method of manufacturing the semiconductor device according to the fifth embodiment also flattens the surface of the bonding layer 2 before depositing the semiconductor chip 3 as in the case of the method of manufacturing the semiconductor device according to the first embodiment, so as to provide the stable bonding layer 2 and also avoid damage to the semiconductor chip 3 derived from the surface configuration of the bonding layer 2.

The method of manufacturing the semiconductor device according to the fifth embodiment only needs to increase the size of the opening 15a of the mask 15 during the process illustrated in FIG. 4 in the method of manufacturing the semiconductor device according to the first embodiment. The other processes of the method of manufacturing the semiconductor device according to the fifth embodiment are the same as those of the method of manufacturing the semiconductor device according to the first embodiment, and overlapping explanations are not repeated below.

OTHER EMBODIMENTS

As described above, the invention has been described according to the first to fifth embodiments, but it should not be understood that the description and drawings implementing a portion of this disclosure limit the invention. Various alternative embodiments of the present invention, examples, and operational techniques will be apparent to those skilled in the art from this disclosure.

The first to fifth embodiments have been illustrated above with the semiconductor device with the structure in which the semiconductor chip 3 is connected to the other components via the bonding wires 6a, 6b, and 6c, but are not limited to this case. For example, the present invention can also be applied to a semiconductor device including an implant substrate provided over the semiconductor chip 3 and having a structure in which pin-like post electrodes are inserted to a printed substrate so as to connect the semiconductor chip 3 and the post electrodes to each other.

The configurations disclosed in the first to fifth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
   a conductive plate having a main surface;
   a semiconductor chip arranged to be opposed to the main surface of the conductive plate; and
   a bonding layer including sinter material and interposed between the conductive plate and the semiconductor chip,
   wherein a porosity of a middle part of the bonding layer is higher than a porosity of a part of end parts of the bonding layer, and the porosity of the middle part of the bonding layer is lower than a porosity of another part of the end parts on an opposite side of the part of the end parts of the bonding layer.

2. The semiconductor device of claim 1, wherein a surface maximum height of the bonding layer is 10 micrometers or less.

3. The semiconductor device of claim 1, wherein the bonding layer has a size common to a size of the semiconductor chip.

4. The semiconductor device of claim 1, wherein the bonding layer has a larger size than the semiconductor chip.

* * * * *